:::: {.columns}
::: {.column}
(12) United States Patent
Prikhodko et al.

(54) PSEUDO-EXTENSIONAL MODE MEMS RING GYROSCOPE

(71) Applicant: Analog Devices, Inc., Norwood, MA (US)

(72) Inventors: Igor P. Prikhodko, Reading, MA (US); Michael Judy, Ipswich, MA (US)

(73) Assignee: Analog Devices, Inc., Wilmington, MA (US)

( * ) Notice: Subject to any disclaimer, the term of this patent is extended or adjusted under 35 U.S.C. 154(b) by 203 days.

(21) Appl. No.: 16/716,386

(22) Filed: Dec. 16, 2019

(65) Prior Publication Data

US 2020/0249020 A1 Aug. 6, 2020

Related U.S. Application Data

(60) Provisional application No. 62/799,382, filed on Jan. 31, 2019.

(51) Int. Cl.
*G01C 19/24* (2006.01)
*G01C 19/5684* (2012.01)
*B81B 3/00* (2006.01)
*G01C 19/567* (2012.01)
*G01C 19/5677* (2012.01)

(52) U.S. Cl.
CPC ............ *G01C 19/24* (2013.01); *B81B 3/0027* (2013.01); *G01C 19/567* (2013.01); *G01C 19/5677* (2013.01); *G01C 19/5684* (2013.01); *B81B 2201/0242* (2013.01)
:::

::: {.column}
(10) Patent No.: US 11,656,077 B2
(45) Date of Patent: May 23, 2023

(58) Field of Classification Search
CPC ............. G01C 19/5684; G01C 19/24; G01C 19/5677; G01C 19/5719; G01C 19/567
See application file for complete search history.

(56) References Cited

U.S. PATENT DOCUMENTS

| | | |
|---|---|---|
| 3,656,354 A | 4/1972 | Lynch |
| 4,655,081 A | 4/1987 | Burdess |
| 4,809,589 A | 3/1989 | Bertrand |
| 5,177,579 A | 1/1993 | Jerman |
| 5,226,321 A | 7/1993 | Varnham et al. |
| 5,383,362 A | 1/1995 | Putty et al. |
| 5,450,751 A | 9/1995 | Putty et al. |
| 5,589,082 A | 12/1996 | Lin et al. |

(Continued)

FOREIGN PATENT DOCUMENTS

| | | |
|---|---|---|
| CN | 104931030 A | 9/2015 |
| EP | 0 860 685 A2 | 8/1998 |

(Continued)

OTHER PUBLICATIONS

[No Author Listed], Angular Rate Detector DAVED®-LL, Application Report SE 100.1. Institute of Micromachining and Information Technology. Dec. 11, 2007; 1 page.

(Continued)

*Primary Examiner* — Helen C Kwok
(74) *Attorney, Agent, or Firm* — Wolf, Greenfield & Sacks, P.C.

(57) ABSTRACT

An extensional mode electrostatic microelectromechanical systems (MEMS) gyroscope is described. The MEMS gyroscope operates in an extensional mode. The MEMS gyroscope comprises a vibrating ring structure that is electrostatically excited in the extensional mode.

20 Claims, 11 Drawing Sheets
:::
::::

(56) References Cited

U.S. PATENT DOCUMENTS

| | | | |
|---|---|---|---|
| 5,616,864 A | 4/1997 | Johnson et al. | |
| 5,652,374 A | 7/1997 | Chia et al. | |
| 5,750,899 A | 5/1998 | Hegner et al. | |
| 5,767,405 A | 6/1998 | Bernstein et al. | |
| 5,783,749 A | 7/1998 | Lee et al. | |
| 5,915,276 A | 6/1999 | Fell | |
| 5,937,275 A | 8/1999 | Munzel et al. | |
| 5,992,233 A | 11/1999 | Clark | |
| 6,105,427 A | 8/2000 | Stewart et al. | |
| 6,128,954 A | 10/2000 | Jiang | |
| 6,151,964 A * | 11/2000 | Nakajima | G01C 19/5684 73/504.13 |
| 6,158,280 A | 12/2000 | Nonomura et al. | |
| 6,209,393 B1 | 4/2001 | Tomikawa et al. | |
| 6,240,781 B1 | 6/2001 | Namerikawa | |
| 6,343,509 B1 | 2/2002 | Fell et al. | |
| 6,401,534 B1 | 6/2002 | Fell et al. | |
| 6,438,242 B1 | 8/2002 | Howarth | |
| 6,481,285 B1 * | 11/2002 | Shkel | G01C 19/5719 73/504.13 |
| 6,626,039 B1 | 9/2003 | Adams et al. | |
| 6,635,509 B1 | 10/2003 | Ouellet | |
| 6,848,305 B2 | 2/2005 | Fell et al. | |
| 6,877,374 B2 | 4/2005 | Geen | |
| 6,892,575 B2 | 5/2005 | Nasiri et al. | |
| 6,958,566 B2 | 10/2005 | Nguyen et al. | |
| 6,978,674 B2 | 12/2005 | Fell et al. | |
| 6,985,051 B2 | 1/2006 | Nguyen et al. | |
| 7,032,451 B2 | 4/2006 | Geen | |
| 7,043,985 B2 | 5/2006 | Ayazi et al. | |
| 7,051,590 B1 | 5/2006 | Lemkin et al. | |
| 7,089,792 B2 | 8/2006 | Geen | |
| 7,106,448 B1 | 9/2006 | Vawter et al. | |
| 7,123,111 B2 | 10/2006 | Brunson et al. | |
| 7,178,378 B2 | 2/2007 | Crawley et al. | |
| 7,204,144 B2 | 4/2007 | Geen | |
| 7,216,539 B2 | 5/2007 | Geen | |
| 7,216,541 B2 | 5/2007 | Kato et al. | |
| 7,295,088 B2 | 11/2007 | Nguyen et al. | |
| 7,323,952 B2 | 1/2008 | Pan et al. | |
| 7,357,025 B2 | 4/2008 | Geen | |
| 7,420,318 B1 | 9/2008 | Pulskamp | |
| 7,427,819 B2 | 9/2008 | Hoen et al. | |
| 7,444,870 B2 | 11/2008 | Uchiyama et al. | |
| 7,458,263 B2 | 12/2008 | Nasiri et al. | |
| 7,492,241 B2 | 2/2009 | Piazza et al. | |
| 7,543,496 B2 | 6/2009 | Ayazi et al. | |
| 7,551,043 B2 | 6/2009 | Nguyen et al. | |
| 7,578,186 B2 | 8/2009 | Matsuhisa | |
| 7,581,443 B2 | 9/2009 | Kubena et al. | |
| 7,617,727 B2 | 11/2009 | Watson | |
| 7,637,156 B2 | 12/2009 | Araki et al. | |
| 7,874,209 B2 | 1/2011 | Stewart | |
| 7,878,060 B2 | 2/2011 | Yoshikawa | |
| 7,895,892 B2 | 3/2011 | Aigner | |
| 7,950,281 B2 | 5/2011 | Hammerschmidt | |
| 8,011,246 B2 | 9/2011 | Stewart | |
| 8,056,413 B2 | 11/2011 | Yazdi | |
| 8,146,425 B2 | 4/2012 | Zhang et al. | |
| 8,151,641 B2 | 4/2012 | Geen | |
| 8,166,816 B2 | 5/2012 | Ayazi et al. | |
| 8,250,919 B2 | 8/2012 | Ofri et al. | |
| 8,372,677 B2 | 2/2013 | Mehregany | |
| 8,408,060 B2 | 4/2013 | Kuang et al. | |
| 8,464,585 B2 | 6/2013 | Raman et al. | |
| 8,479,575 B2 | 7/2013 | Kempe | |
| 8,593,155 B2 | 11/2013 | Sparks et al. | |
| 8,616,055 B2 | 12/2013 | Geen | |
| 8,616,056 B2 | 12/2013 | Sammoura et al. | |
| 8,631,700 B2 | 1/2014 | Sammoura et al. | |
| 8,794,068 B2 | 8/2014 | Judy et al. | |
| 8,803,624 B2 | 8/2014 | Phan Le | |
| 8,919,199 B2 | 12/2014 | Judy et al. | |
| 9,039,976 B2 | 5/2015 | Sparks et al. | |
| 9,091,544 B2 | 7/2015 | Johari-Galle | |
| 9,212,908 B2 | 12/2015 | Geen et al. | |
| 9,599,471 B2 | 3/2017 | Vohra et al. | |
| 9,712,128 B2 | 7/2017 | Doll et al. | |
| 10,032,976 B2 | 7/2018 | Zolfagharkhani et al. | |
| 10,234,288 B2 | 3/2019 | Tallur et al. | |
| 10,240,925 B1 * | 3/2019 | Perahia | G01C 19/5684 |
| 10,527,419 B1 * | 1/2020 | Challoner | G01C 19/5684 |
| 2002/0029637 A1 | 3/2002 | Matsumoto et al. | |
| 2003/0051550 A1 | 3/2003 | Nguyen et al. | |
| 2003/0119220 A1 | 6/2003 | Mlcak et al. | |
| 2003/0183888 A1 | 10/2003 | Bar-Sadeh et al. | |
| 2004/0050160 A1 | 3/2004 | Bae et al. | |
| 2004/0051595 A1 | 3/2004 | Yoshimine et al. | |
| 2004/0055380 A1 * | 3/2004 | Shcheglov | G01C 19/5684 73/504.12 |
| 2004/0085000 A1 | 5/2004 | Ogiura | |
| 2004/0134279 A1 | 7/2004 | Fell et al. | |
| 2005/0072230 A1 | 4/2005 | Koike et al. | |
| 2005/0104675 A1 * | 5/2005 | Brunson | G01C 19/5684 331/108 C |
| 2005/0148065 A1 | 7/2005 | Zhang et al. | |
| 2006/0133953 A1 | 6/2006 | Zhang et al. | |
| 2006/0196253 A1 | 9/2006 | Crawley et al. | |
| 2006/0197411 A1 | 9/2006 | Hoen et al. | |
| 2006/0237806 A1 | 10/2006 | Martin et al. | |
| 2006/0238078 A1 | 10/2006 | Liu | |
| 2007/0046398 A1 | 3/2007 | Nguyen et al. | |
| 2007/0172940 A9 | 7/2007 | Manalis et al. | |
| 2007/0220971 A1 | 9/2007 | Ayazi et al. | |
| 2007/0256495 A1 | 11/2007 | Watson | |
| 2007/0284971 A1 | 12/2007 | Sano et al. | |
| 2008/0054759 A1 | 3/2008 | Ayazi et al. | |
| 2008/0115579 A1 | 5/2008 | Seeger et al. | |
| 2008/0168838 A1 | 7/2008 | Martin et al. | |
| 2008/0180890 A1 | 7/2008 | Bolis | |
| 2008/0190181 A1 | 8/2008 | Khuri-Yakub et al. | |
| 2008/0282833 A1 | 11/2008 | Chaumet | |
| 2009/0064782 A1 | 3/2009 | Yazdi | |
| 2009/0095079 A1 | 4/2009 | Ayazi | |
| 2009/0114016 A1 | 5/2009 | Nasiri et al. | |
| 2009/0133498 A1 | 5/2009 | Lo et al. | |
| 2009/0173157 A1 | 7/2009 | Stewart | |
| 2009/0173158 A1 | 7/2009 | Gehring | |
| 2009/0188317 A1 | 7/2009 | Aigner | |
| 2009/0188318 A1 | 7/2009 | Zarabadi et al. | |
| 2009/0241662 A1 | 10/2009 | Supino et al. | |
| 2009/0266162 A1 | 10/2009 | Ayazi et al. | |
| 2009/0277271 A1 | 11/2009 | Seppa et al. | |
| 2010/0058861 A1 | 3/2010 | Kuang et al. | |
| 2010/0071465 A1 * | 3/2010 | Stewart | G01C 19/5719 73/504.02 |
| 2010/0107761 A1 | 5/2010 | Ofri et al. | |
| 2010/0148341 A1 | 6/2010 | Fuji et al. | |
| 2010/0218606 A1 | 9/2010 | Fell | |
| 2010/0263445 A1 | 10/2010 | Hayner et al. | |
| 2010/0294039 A1 | 11/2010 | Geen | |
| 2011/0023601 A1 | 2/2011 | Ikeda et al. | |
| 2011/0048131 A1 | 3/2011 | Reinmuth | |
| 2011/0192226 A1 | 8/2011 | Hayner et al. | |
| 2011/0254599 A1 | 10/2011 | Dikshit et al. | |
| 2012/0013774 A1 | 1/2012 | Kim et al. | |
| 2012/0111112 A1 | 5/2012 | Sammoura et al. | |
| 2012/0111113 A1 | 5/2012 | Sammoura et al. | |
| 2012/0112765 A1 * | 5/2012 | Sparks | G01N 29/036 324/633 |
| 2012/0137773 A1 | 6/2012 | Judy et al. | |
| 2012/0137774 A1 | 6/2012 | Judy et al. | |
| 2012/0195797 A1 | 8/2012 | Sparks et al. | |
| 2012/0227487 A1 * | 9/2012 | Ayazi | G01C 19/56 216/6 |
| 2013/0192363 A1 | 8/2013 | Loreck et al. | |
| 2013/0199294 A1 | 8/2013 | Townsend et al. | |
| 2013/0319116 A1 * | 12/2013 | Johari-Galle | G01C 19/5684 73/504.13 |
| 2015/0128701 A1 | 5/2015 | Vohra et al. | |
| 2015/0354959 A1 * | 12/2015 | Senkal | G01C 19/5684 73/504.13 |
| 2016/0084654 A1 | 3/2016 | Senkal et al. | |
| 2016/0084656 A1 | 3/2016 | Villien | |

(56) References Cited

U.S. PATENT DOCUMENTS

| | | | | |
|---|---|---|---|---|
| 2016/0123735 | A1* | 5/2016 | Gregory | G01C 19/5684 |
| | | | | 73/504.13 |
| 2016/0153779 | A1* | 6/2016 | Vohra | G01P 15/18 |
| | | | | 73/504.12 |
| 2016/0341550 | A1* | 11/2016 | Geckeler | G01C 19/5705 |
| 2017/0074656 | A1* | 3/2017 | Tallur | G01C 19/5684 |
| 2017/0268879 | A1 | 9/2017 | Andersson et al. | |
| 2018/0245946 | A1 | 8/2018 | Weinberg et al. | |
| 2018/0266822 | A1 | 9/2018 | Giner | |
| 2019/0346266 | A1* | 11/2019 | Kuisma | G01C 19/5684 |

FOREIGN PATENT DOCUMENTS

| | | |
|---|---|---|
| EP | 1 788 385 A1 | 5/2007 |
| EP | 2 078 925 A2 | 7/2009 |
| EP | 2 216 904 A1 | 8/2010 |
| EP | 2 573 516 A1 | 3/2013 |
| GB | 2 113 842 A | 8/1983 |
| JP | H09116250 A | 5/1997 |
| JP | 2004301734 A | 10/2004 |
| JP | 2008064742 A | 3/2008 |
| JP | 2009531707 A | 9/2009 |
| JP | 2013007622 A | 1/2013 |
| WO | WO 2007/061610 A1 | 5/2007 |
| WO | WO 2009/066640 A1 | 5/2009 |
| WO | WO 2011/026100 A1 | 3/2011 |
| WO | WO 2018/057071 A1 | 3/2018 |

OTHER PUBLICATIONS

[No Author Listed], Angular Rate Detector DAVED®-RR, Application Report SE 090.2. Institute of Micromachining and Information Technology. Dec. 11, 2007; 1 page.
[No Author Listed], Control of MEMS Coriolis Vibratory Gyroscopes. Zurich Instruments. Application Note, Products: HF2PLL, HF2LI-MF, HF2LI-MOD. Oct. 2015; 9 pages. https://www.zhinst.com/sites/default/files/zi_appnote_mems_gyrocope.pdf.
[No Author Listed], Inertial Sensor Technology. Silicon Sensing. 2017; 3 pages. http://www.siliconsensing.com/technology/evolution-of-vsg.
Ahn et al., Mode-Matching of Wineglass Mode Disk Resonator Gyroscope in (100) Single Crystal Silicon, Journal of Microelectromechanical Systems. 2015;2(24):343-50.
Ayazi et al., A HARPSS Polysilicon Vibrating Ring Gyroscope. Journal of Microelectromechanical Systems. Jun. 2, 2001;10(2):169-79.
Ayazi et al., Design and Fabrication of A High-Performance Polysilicon Vibrating Ring Gyroscope. MEMS 98. IEEE. Eleventh Annual International Workshop on Micro Electro Mechanical Systems. An Investigation of Micro Structures, Sensors, Actuators, Machines and Systems. Jan. 25, 1998:621-26.
Ayazi et al., High Aspect-Ratio Combined Poly and Single-Crystal Silicon (HARPSS) MEMS Technology, Journal of Microelectromechanical Systems. Sep. 2000;9(3):288-94.
Ayazi, Integrated Solutions for Motion Sensing in Handheld Devices. Qualtre Inc. Oct. 2010:1-3.
Benes et al., Comparison Between BAW and SAW Sensor Principles. IEEE Transactions on Ultrasonics, Ferroelectrics, and Frequency Control, Sep. 1998;45(5):1314-30.
Bernstein, An Overview of MEMS Inertial Sensing Technology. Sensors. Feb. 2003;20(2):1-6. http://www.sensorsmag.com/sensors/acceleration-vibration/an-overview-mems-inertial-sensing-technology-970.
Cao et al., Structure Design and Simulation Analysis of MEMS Ring Vibrating Gyroscope. 2nd IEEE Advanced Information Management, Communicates, Electronic and Automation Control Conference (IMCEC). May 25, 2018:571-74.
Celikel et al., Optoelectronic design parameters of interferometric fiber optic gyroscope with LiNbO₃ having north finder capability and earth rotation rate measurement. Indian Journal of Pure & Applied Physics. Jun. 2010; 48:375-84.
Challoner et al., Boeing Disc Resonator Gyroscope. 2014 IEEE/ION Position, Location and Navigation Symposium—PLANS. May 5, 2014:504-14.
Doe, Qualtré targets 3-axis gyro market with alternative technology. MEMS Trends. Jul. 2010; 3:1.
Drafts, Acoustic Wave Technology Sensors. Sensors. Oct. 1, 2000:1-5.
Dubois, Thin film bulk acoustic wave resonators: a technology overview. Proceedings of the MEMSWAVE 03, Toulouse, France, Jul. 2-4, 2003;1-4.
Efimovskaya et al., On Ordering of Fundamental Wineglass Modes in Toroidal Ring Gyroscope. IEEE Sensors. Oct. 2016:1-3.
Ge et al., Simultaneous exploitation of the fundamental and higher order wineglass modes in a vibratory gyro. IEEE International Symposium on Inertial Sensors and Systems (ISISS) Proceedings. Mar. 23, 2015; 1-4.
Geen et al., New iMEMS® Angular-Rate-Sensing Gyroscope. Analog Dialogue. Mar. 2, 2003; 37(3):1-4.
Johari, Micromachined Capacitive Silicon Bulk Acoustic Wave Gyroscopes. PhD diss., Georgia Institute of Technology, Dec. 2008; 1-28.
Johari et al., Capacitive Bulk Acoustic Wave Silicon Disk Gyroscopes. International Electron Devices Meeting, Dec. 2006; 11:1-4.
Johari et al., High-Frequency Capacitive Disk Gyroscopes in (100) and (111) Silicon. IEEE 20th International Conference on Micro Electro Mechanical Systems (MEMS). Jan. 21, 2007; 47-50.
Johnson, Resonators and coupling elements. In: Mechanical filters in electronics. 1983. Chapter 3:83-97.
Johnson, Qualtre Preps Solid State MEMS Gyros. MEMS Investor Journa!. Apr. 8, 2010:1-2. http://www.memsinvestorjoumal.com/2010/Q4/qualtre-preps-solidstate-mems-gyros.html. [last accessed Dec. 19, 2011].
Leland, Adaptive Mode Tuning for Vibrational Gyroscopes. IEEE Transactions on Control Systems Technology, Mar. 20, 2003;11(2):242-7.
Nasiri, A Critical Review of MEMS Gyroscopes Technology and Commercialization Status. InvenSense. Downloaded Jan. 15, 2000; 8 pages.
Nguyen, Micromechanical Resonators for Oscillators and Filters. IEEE Ultrasonics Symposium, Proceedings. An International Symposium, Nov. 7, 1995;1:489-99.
Oboe et al., Control of a Z-Axis MEMS Vibrational Gyroscope. IEEE/ASME Transactions on Mechatronics. Aug. 2005;10(4):364-70.
Park et al., Laterally Oscillated and Force-Balanced Micro Vibratory Rate Gyroscope Supported by Fish Hook Shape Springs. IEEE The Tenth Annual International Workshop on Micro Electro Mechanical Systems. An Investigation of Micro Structures, Sensors, Actuators, Machines and Robots. Jan. 26, 1997:494-99.
Park et al., Oscillation Control Algorithms for Resonant Sensors with Applications to Vibratory Gyroscopes. Sensors. Aug. 2009; 9(8):5952-67.
Prikhodko et al., Mode-Matched MEMS Coriolis Vibratory Gyroscopes: Myth or Reality? IEEE/ION Position, Location and Navigation Symposium (PLANS) Apr. 11, 2016:1-4.
Prikhodko et al., Pseudo-Extensional Mode MEMS Ring Gyroscope. IEEE International Symposium on Inertial Sensors and Systems (INERTIAL), Apr. 1, 2019:1-4.
Ramirez, 45 RF MEMS Based Circuit Design—conocimeintos.com.ve. PZE Energy Harvester. Jul. 24, 2010:1-4. http://conocimientosrfmemsdesign.blogspot.com/2010/Q7/pze-energy-harvester.html [last accessed Dec. 19, 2011].
Satrom et al., Disc Resonating Gyroscopes: A Summary of a Recent Development in MEMS Technology, Dec. 1, 2006:1-15.
Saukoski, System and Circuit Design for a Capacitive MEMS Gyroscope. Doctoral Dissertation, TKK Dissertations 116, Helsinki University of Technology, 2008:1-279.
Senkal et al., 100K Q-Factor Toroidal Ring Gyroscope Implemented in Wafer-Level Epitaxial Silicon Encapsulation Process. IEEE 27th International Conference on Micro Electro Mechanical Systems (MEMS). Jan. 26, 2014:24-7.

(56) References Cited

OTHER PUBLICATIONS

Sonmezoglu et al., Simultaneous Detection of Linear and Coriolis Accelerations on a Mode-Matched MEMS Gyroscope. IEEE 27th International Conference on Micro Electro Mechanical Systems (MEMS). Jan. 26, 2014:32-5.

Tang et al., A Packaged Silicon MEMS Vibratory Gyroscope for Microspacecraft. IEEE the Tenth Annual International Workshop on Micro Electro Mechanical Systems. An Investigation of Micro Structures, Sensors, Actuators, Machines and Robots. Jan. 26, 1997:500-05.

Yang et al., An electro-thermal bimorph-based microactuator for precise track-positioning of optical disk drives. Journal of Micromechanics and Microengineering. Mar. 22, 2005;15(5):958-65.

Efimovskaya et al., On Ordering of Fundamental Wineglass Modes in Toroidal Ring Gyroscope. IEEE Sensors Oct. 2016; 3 pages.

\* cited by examiner

PSEUDO-EXTENSIONAL MODE MEMS RING GYROSCOPE

RELATED APPLICATIONS

This application claims the benefit under 35 USC § 119(e) of U.S. Provisional Application Ser. No. 62/799,382, filed Jan. 31, 2019, under entitled "PSEUDO-EXTENSIONAL MODE MEMS RING GYROSCOPE", which is hereby incorporated herein by reference in its entirety.

FIELD OF THE DISCLOSURE

The present application relates to microelectromechanical systems (MEMS) gyroscopes.

BACKGROUND

MEMS gyroscopes are used to detect rotation. Some MEMS gyroscopes have a disc or a ring as a proof mass. Such gyroscopes operate the proof mass in a wineglass mode, in which the proof mass deforms without any change to its in-plane width or to its thickness.

BRIEF SUMMARY

A MEMS gyroscope that operates in an extensional mode is described. In some embodiments, the MEMS gyroscope may include a vibrating ring structure that is excited in an extensional mode and signals generated based on such excitation are sensed only in that extensional mode.

In certain embodiments, a MEMS gyroscope is provided that comprises a vibrating ring structure; at least one pair of drive electrodes configured to electrostatically apply a voltage to the vibrating ring structure to excite the vibrating ring structure in an extensional mode, wherein the at least one pair of drive electrodes comprises a first drive electrode and second drive electrode positioned on opposite sides of the vibrating ring structure; and a first support structure configured to suspend the vibrating ring structure, the first support structure positioned on an inner side of the vibrating ring structure.

In certain embodiments, an extensional mode gyroscope is provided that comprises a composite mesh ring comprising a first plurality of flexural portions; at least one pair of drive electrodes configured to electrostatically apply a voltage to the composite mesh ring to excite the composite mesh ring in an extensional mode; and one or more support structures configured to allow movement of substantially equal amplitude of two or more flexural portions of the first plurality of flexural portions of the composite mesh ring when excited in the extensional mode.

In certain embodiments, a method of operating a microelectromechanical systems (MEMS) gyroscope having a composite mesh ring comprising a closed contour inner edge and a closed contour outer edge, at least one pair of drive electrodes, and at least one pair of sense electrodes is provided that comprises electrostatically exciting, via the at least one pair of drive electrodes, the composite mesh ring in an in-plane extensional mode, wherein the closed contour inner edge and the closed contour outer edge of the composite mesh ring move with substantially equal amplitude upon excitation of the composite mesh ring in the in-plane extensional mode; and electrostatically sensing, via the at least one pair of sense electrodes, one or more signals generated by the composite mesh ring in response to the composite mesh ring being excited in the in-plane extensional mode.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Aspects of the present application provide an extensional mode electrostatic MEMS gyroscope. The MEMS gyroscope operates in an extensional mode without operating in a wineglass mode. The MEMS gyroscope may include a vibrating ring structure that is electrostatically excited and sensed in an in-plane extensional mode. In an non-limiting embodiment, the vibrating ring structure may include a composite mesh ring proof mass. In another non-limiting embodiment, the vibrating ring structure may include a solid ring proof mass having an annulus shape.

Figure 1:
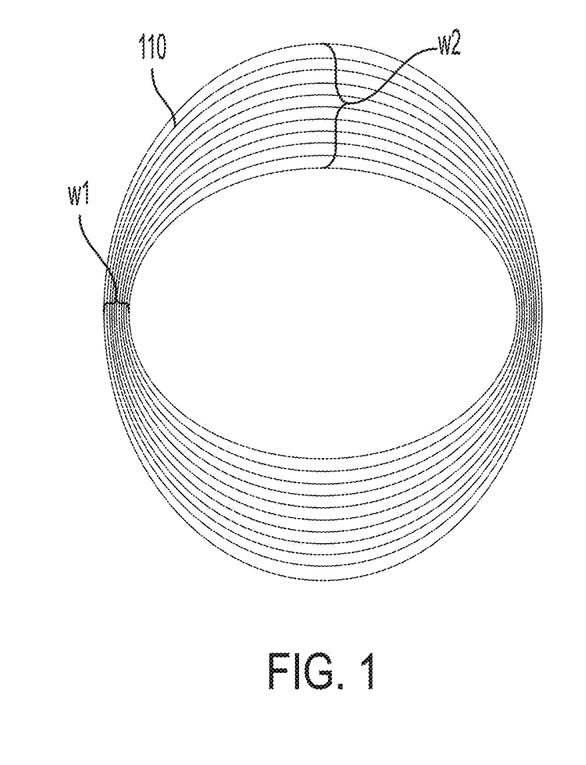
FIG. 1 illustrates an example extensional mode of vibration of a gyroscope where ring width varies across its circumference according to a non-limiting embodiment.

Conventional ring gyroscopes typically utilize wineglass vibratory modes. These modes are classified by the number of nodes—the points of zero displacement—with a common approach to operate the ring gyroscope in a fundamental, n=2 mode. Some higher node modes (n=3, 4) exhibit tolerance to fabrication imperfections but lower angular gain (Bryan's factor K, 0<K≤1), and hence degradation in noise performance. Applicant has appreciated this is, however, only true for the modes where the in-plane ring width stays constant during vibration (e.g., a wineglass mode). On the other hand, extensional modes of vibration are higher order modes where a ring width varies (i.e., expands and contracts) across its circumference. As shown in FIG. 1, the ring width varies such that width w2 is larger than width w1. Extensional modes may have n=2, 3, 4 variants. Aspects of the present application provide operation of the MEMS gyroscope in a higher order mode without compromising the angular gain. In some embodiments, the MEMS gyroscope including a ring structure 110 is operated in an extensional mode with a similar or substantially same angular gain as a conventional ring gyroscope of substantially the same size/footprint operating in a wineglass mode. In some embodiments, the mode of operation of the MEMS gyroscope may be selected by changing a frequency of excitation.

Figure 2A:
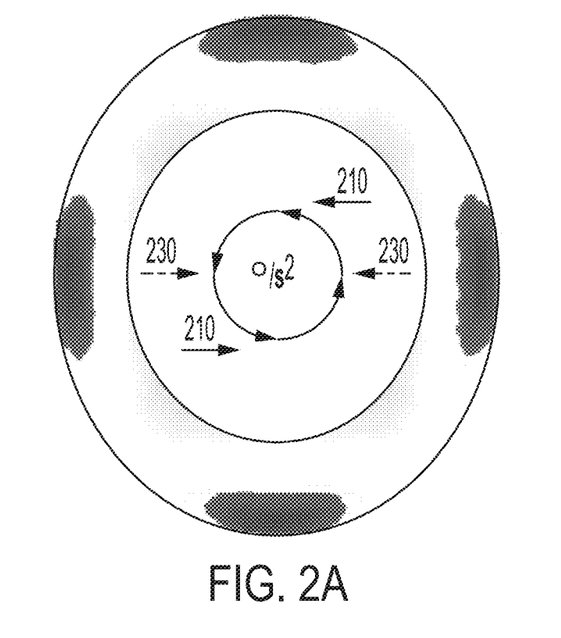
FIG. 2A illustrates a wineglass mode of a gyroscope where angular accelerations are not rejected according to a non-limiting embodiment.
Figure 2B:
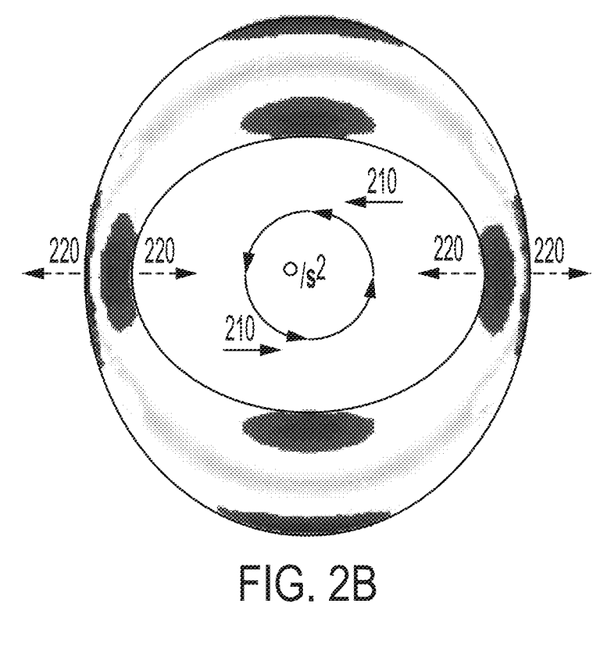
FIG. 2B illustrates rejection of angular accelerations in an extensional mode gyroscope according to a non-limiting embodiment.

Conventional MEMS and BAW gyroscopes with electrostatic transduction suffer from the impact of changes in electrostatic sensing gap distances introduced from external stresses such as thermal gradients, external shocks, mechanical stress and torque. Changes in gap spacing amount to changes in sensitivity (scale factor) and eventually zero-rate offset for these sensors making them vulnerable to external vibrations which have a negative impact in navigation applications. Aspects of the present application utilize an extensional mode of vibration with inherent vibration rejection properties while preserving a SWaP+C (size, weight, power, and cost) metric associated with electrostatically transduced MEMS gyroscopes. For example, the extensional mode allows for local rejection of linear accelerations as well as angular accelerations 210 (as shown by forces 220 in FIG. 2B) as compared to the fundamental wineglass n=2 mode that rejects linear accelerations but not angular accelerations 210 (as shown by forces 230 in FIG. 2A) by matching electrodes across the diameter of the ring.

In some embodiments, the MEMS gyroscope may include a vibrating ring structure, at least one pair of drive electrodes, and at least one pair of sense electrodes. The at least one pair of drive electrodes and at least one pair of sense electrodes may be positioned on opposite sides of the vibrating ring structure without directly connecting the vibrating ring structure. In other words, the drive and sense electrodes may be placed such that there is a gap between the electrodes and the vibrating ring structure so as to provide electrostatic operation.

In some embodiments, the drive electrodes electrostatically excite an in-plane extensional mode of the vibrating ring structure and the sense electrodes electrostatically sense only the in-plane extensional mode of the vibrating ring structure. In some implementations, one drive electrode of the at least one pair of drive electrodes is electrically connected to another drive electrode of the at least one pair of drive electrodes. Similarly, one sense electrode of the at least one pair of drive electrodes is electrically connected to another sense electrode of the at least one pair of sense electrodes.

In a non-limiting embodiment, the vibrating ring structure comprises a solid ring proof mass that is excited in an extensional mode. Electrodes (e.g., the drive and sense electrodes) can be positioned to drive the solid ring in the extensional mode and sense only the extensional mode of the solid ring.

Figure 3A:
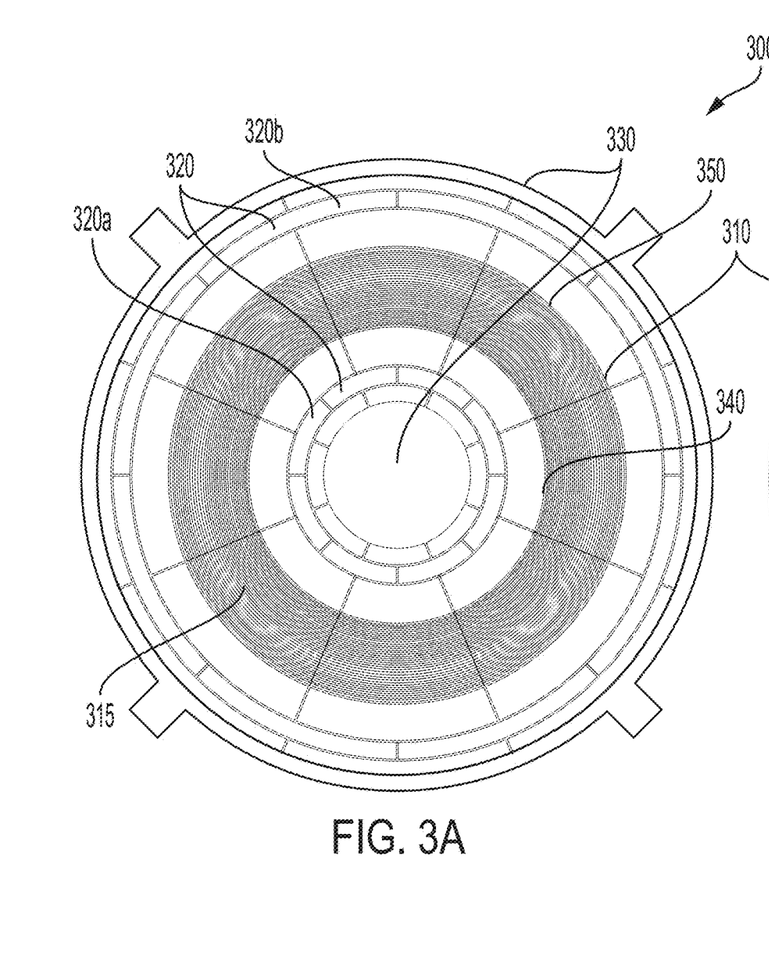
FIG. 3A illustrates an example layout of a MEMS ring gyroscope showing a composite mesh ring vibrating structure according to a non-limiting embodiment.

FIG. 3A illustrates an example layout 300 of a MEMS ring gyroscope showing a composite mesh ring vibrating structure. In a non-limiting embodiment, the vibrating ring structure comprises a composite mesh ring 310 that is excited in an extensional mode. In some embodiments, the composite mesh ring 310 may include a plurality of flexural portions 315 defining a closed contour inner edge 340 and a closed contour outer edge 350. In a non-limiting embodiment, the plurality of flexural portions 315 may include a plurality of concentric rings. In a non-limiting embodiment, the composite mesh ring 310 includes a plurality of closely-spaced rings that are free-floating (i.e., individual rings move equally when excited) such that vibrational energy is concentrated in the composite mesh ring 310. In another non-limiting embodiment, the composite mesh ring 310 may comprise a connected ring structure including a number of flexural members or elements connecting a number of concentric rings. The composite mesh ring 310 described herein may have a lower resonant frequency as compared to conventional ring structures. In a non-limiting embodiment, for an n=2 extensional mode, the composite mesh ring 310 may include 40 individual rings connected to each other by 8 flexural members/elements (e.g., studs 410 shown in FIG. 4) with 22.5 degree offset in every other ring to lower the resonant frequency and increase Q-factor due to thermoelastic damping. It will be appreciated that for higher (e.g., n=3, 4, or higher) order modes, composite mesh rings with different number of rings and studs with different degree offsets may be used without departing from the scope of this disclosure.

As shown in FIG. 3A, the MEMS ring gyroscope may include one or more support structures 320 that are configured to suspend the composite mesh ring 310 relative to a substrate (not shown) via one or more anchors 330. In a non-limiting embodiment, a first support structure 320a of the one or more support structures 320 may be positioned on an inner side of the composite mesh ring 310. In a non-limiting embodiment, a second support structure 320b of the one or more support structures 320 may be positioned on an outer side of the composite mesh ring 310. In a non-limiting embodiment, the one or more anchors 330 includes an inner anchor positioned on an inner side of the first support structure 320a. In another non-limiting embodiment, the one or more anchors 330 includes an outer anchor positioned in an outer side of the second support structure 320b. In yet another non-limiting embodiment, the one or more anchors 330 includes the inner anchor and the outer anchor.

Figure 4:
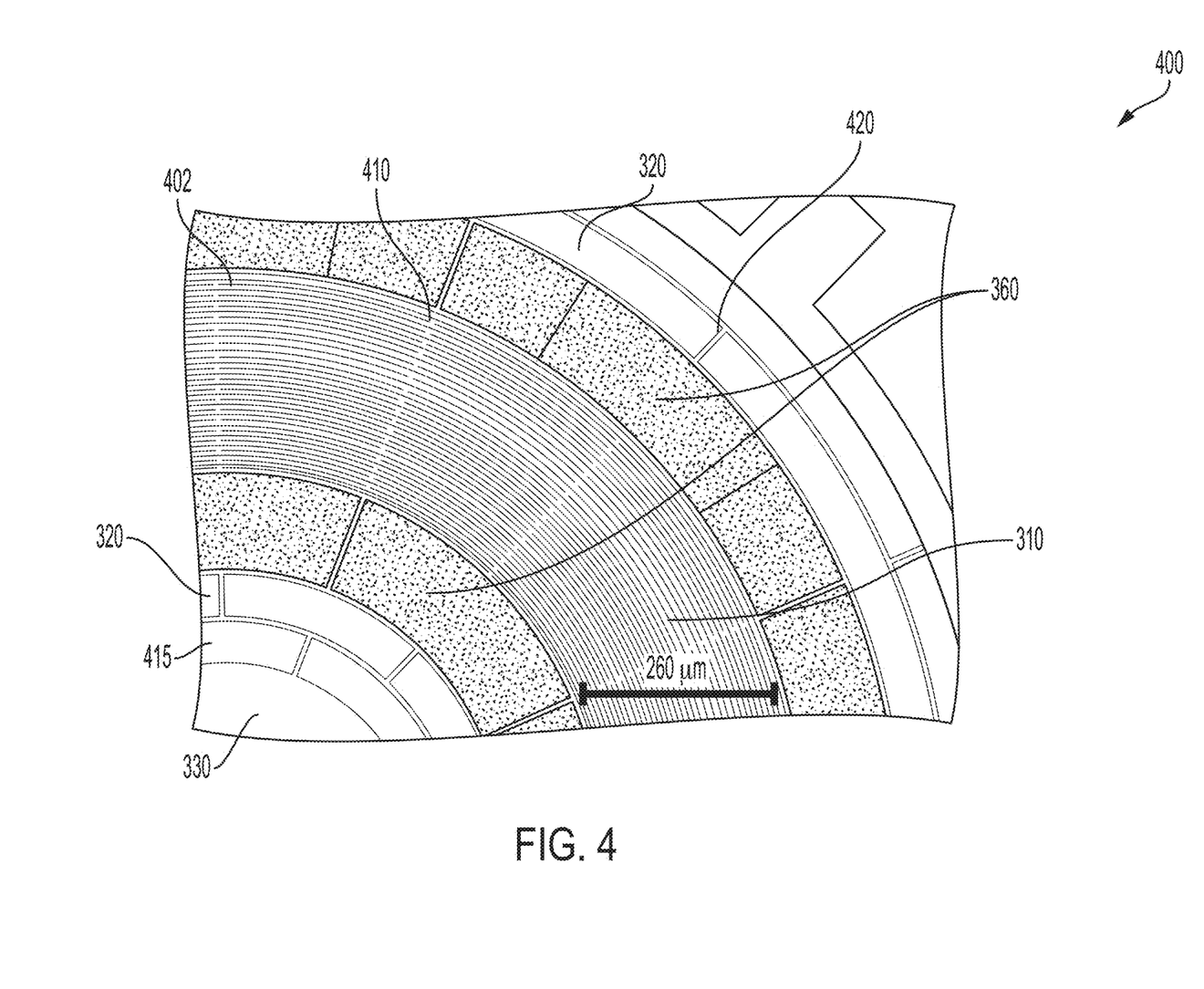
FIG. 4 illustrates an exploded view of the composite mesh ring vibrating structure of FIG. 3B according to a non-limiting embodiment.

FIG. 4 illustrates an exploded view 400 of a portion of the composite mesh ring 310. As shown in FIG. 4, the concentric rings of the composite mesh ring 310 are arranged with a first spacing 402 between sections of the rings. In some embodiments, each of the one or more support structures 320 includes a plurality of flexural portions (e.g., rings) 415 arranged with a second spacing 420, as shown in FIG. 4. In a non-limiting embodiment, the second spacing 420 associated with the support structures 320 is larger than the first spacing 402 associated with the composite mesh ring 310. In a non-limiting embodiment, the second spacing may be 5 times larger than the first spacing, or between 3 and 10 times larger, as non-limiting examples. The larger spacing provides for a flexible suspension structure for the composite mesh ring 310, thereby allowing movement of substantially equal amplitude of the closed contour inner edge 340 and the closed contour outer edge 350 of the composite mesh ring 310. In a non-limiting embodiment, support structures 320 on either side of the composite mesh ring allow movement of substantially equal amplitude of at least an innermost ring and an outermost ring of composite mesh ring 310. Applicant has appreciated that while vibrational energy in conventional devices operating in a wineglass mode is concentrated either at the outermost ring or the innermost ring depending on anchor location, the vibrational energy of the extensional mode device described herein is concentrated substantially equally at the inner and outer sides of the composite mesh ring 310, allowing for localized differential transduction when electrodes are placed on opposite sides of the composite mesh ring 310. The support structures 320 ensure that the vibrational energy is concentrated inside the ring and away from the anchors thus decoupling vibratory motion from a substrate and improving Q-factor due to anchor losses. In embodiments where both inner and outer anchors are provided, the anchors stiffen the translational modes which are sensitive to external vibrations thereby reducing susceptibility to shock/G-sensitivity.

Various geometric parameters for a non-limiting embodiment of a composite mesh ring are shown in Table 1 below.

TABLE 1

| Composite Ring Parameters | |
|---|---|
| Device diameter (mm) | 1.78 |
| Device layer thickness (μm) | 40 |
| Capacitive gaps (μm) | 1.5 |
| Individual ring width (μm) | 5 |
| Number of individual rings | 40 |

Figure 3B:
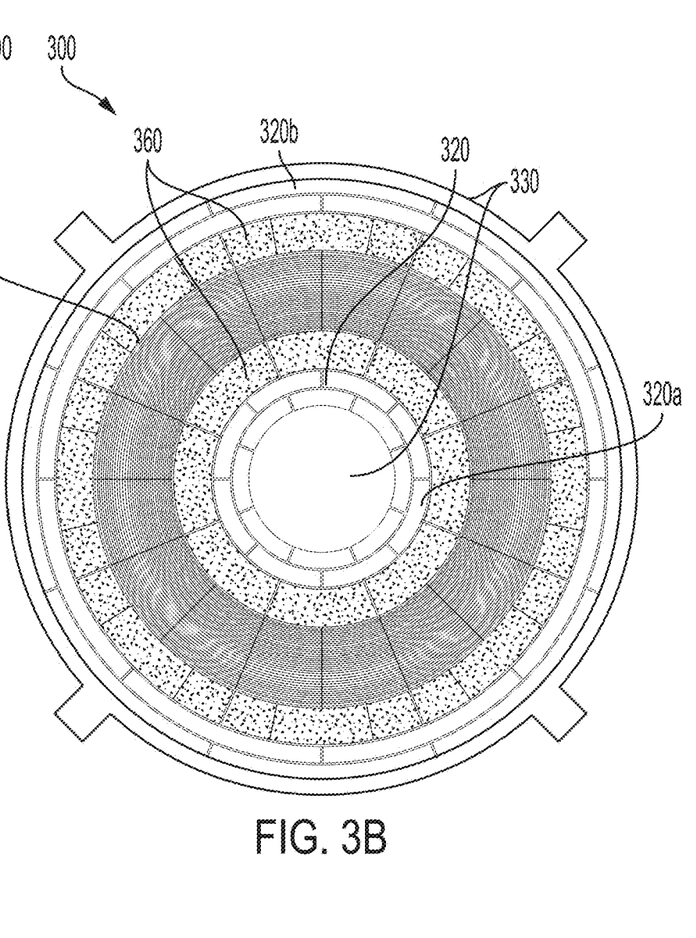
FIG. 3B illustrates an example layout of the MEMS ring gyroscope of FIG. 3A further showing placement of electrodes that are configured to electrostatically drive and electrostatically sense an extensional mode of the composite mesh ring according to a non-limiting embodiment.

FIG. 3B illustrates an example layout of the MEMS ring gyroscope of FIG. 3A further showing placement of electrodes 360 that are configured to electrostatically drive and electrostatically sense an extensional mode of the composite mesh ring 310. Electrodes 360 may include drive and sense electrodes that are positioned to drive the composite mesh ring 310 in the extensional mode and sense only the extensional mode of the composite mesh ring 310. In some embodiments, an extensional mode of vibration may be referred to as a pseudo-extensional mode, where the excitation may appear as two superimposed wineglass n=2 modes driven in anti-phase relative to each other. The composite mesh ring 310 in extensional/pseudo-extensional mode may be driven at a much lower frequency than conventional ring structures. The pseudo-extensional mode of vibration may be used for rate sensing with Q-factors of 110,000 and noise level of 0.06°/√hr (for a 2×2 mm² gyroscope, for example). In a non-limiting embodiment, the extensional/pseudo-extensional mode is seen as common-mode with respect to the electrodes 360.

Figure 5A:
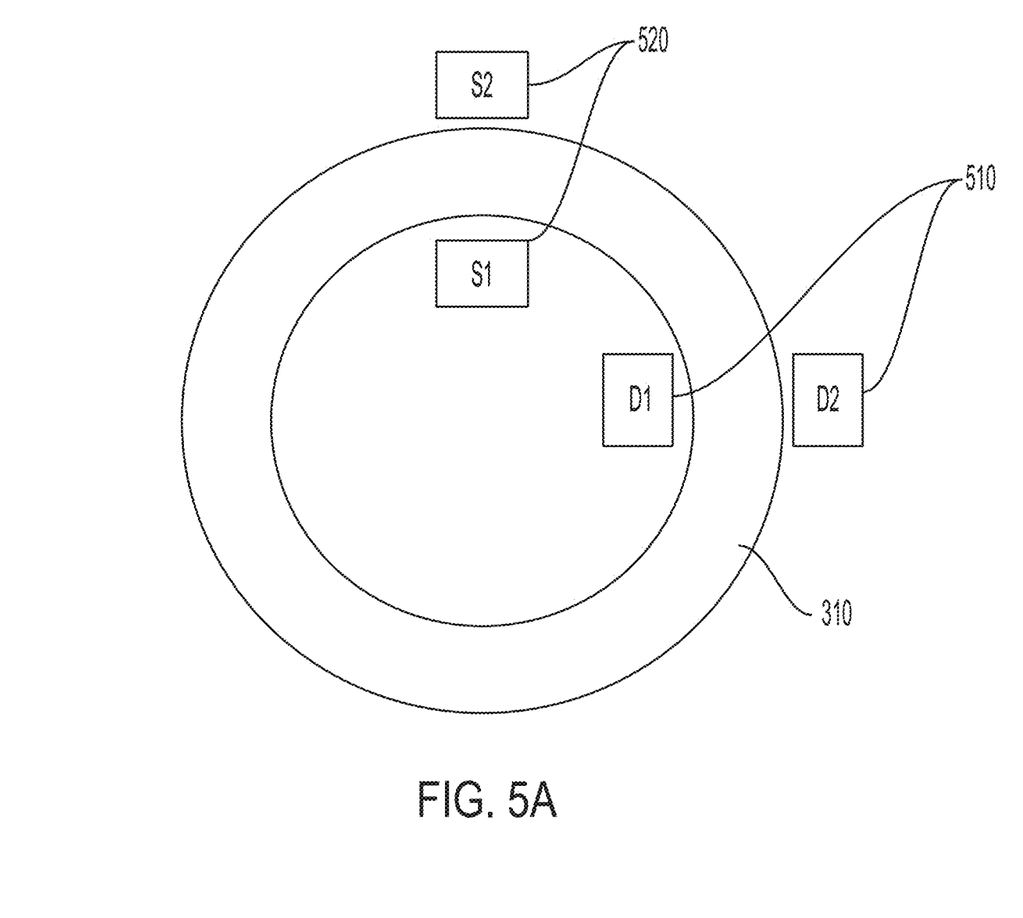
FIG. 5A illustrates an example arrangement of drive and sense electrodes in the MEMS ring gyroscope of FIG. 3A according to a non-limiting embodiment.

In some embodiments, the electrodes 360 are positioned on opposite sides of the composite mesh ring 310. FIG. 5A illustrates an example arrangement of drive and sense electrodes according to a non-limiting embodiment. The electrodes 360 may include at least one pair of drive or forcer electrodes 510 positioned on opposite sides of the composite mesh ring 310 and at least one pair of sense of pick-off electrodes 520 positioned on opposite sides of the composite mesh ring 310. The drive electrodes (D1, D2) in pair 510 are electrically connected and the sense electrodes (S1, S2) in pair 520 are electrically connected. The pair of drive electrodes 510 may be configured to electrostatically apply a voltage to the composite mesh ring 310 to excite the ring in an in-plane extensional mode. The pair of sense electrodes 520 may be configured to sense the in-plane extensional mode of the composite mesh ring 310 and output signals that may be used to determine rotation. In a non-limiting embodiment, a first support structure 320a of the one or more support structures 320 may be positioned on an inner side of a first electrode (e.g., D1, S1) of the pair of drive/sense electrodes. In a non-limiting embodiment, a second support structure 320b of the one or more support structures 320 may be positioned on an outer side of a second electrode (e.g., D2, S2) of the pair of drive/sense electrodes.

Figure 5B:
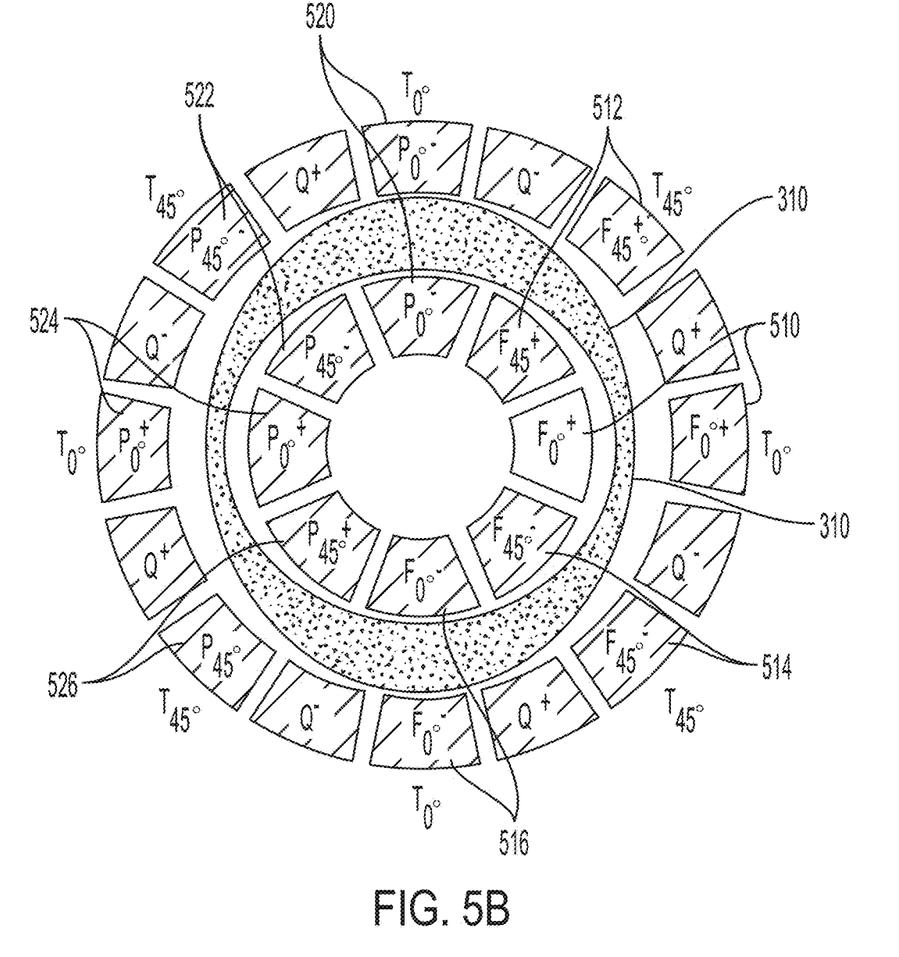
FIG. 5B illustrates an alternative example arrangement of drive and sense electrodes in the MEMS ring gyroscope of FIG. 3A according to a non-limiting embodiment.

In a non-limiting embodiment of FIG. 5B, the electrodes 360 include four pairs (510, 512, 514, 516) of inner/outer drive (F) electrodes, four pairs (520, 522, 524, 526) of inner/outer sense (P) electrodes, and eight quadrature tuning (Q) electrodes. In addition, frequency tuning (T) electrodes may be provided that are shared between the drive and sense electrodes. In a non-limiting embodiment, a first support structure 320a of the one or more support structures 320 may be positioned on an inner side of the set of inner electrodes in the pairs of drive/sense electrodes, as can be seen on FIG. 3B. In a non-limiting embodiment, a second support structure 320b of the one or more support structures 320 may be positioned on an outer side of a set of outer electrodes of the pair of drive/sense electrodes, as can be seen in FIG. 3B.

In a non-limiting embodiment, FIG. 5B shows the electrode configuration for excitation of extensional/pseudo-extensional mode only. The extensional/pseudo-extensional mode is less sensitive to differential-gap change because the electrode configuration of FIG. 5B is more sensitive to common-mode gap change, which in turn makes the extensional/pseudo-extensional mode less sensitive to shock/vibrations and hence ideal for applications with harsh, high-G environments.

In some embodiments, to allow for extensional mode excitation and sensing, the drive electrodes in each pair (510, 512, 514, 516) are electrically connected and the sense electrodes (520, 522, 524, 526) in each pair are electrically connected. In addition, all the quadrature tuning electrodes are electrically connected to each other and all the frequency tuning electrodes are electrically connected to each other.

Figure 6A:
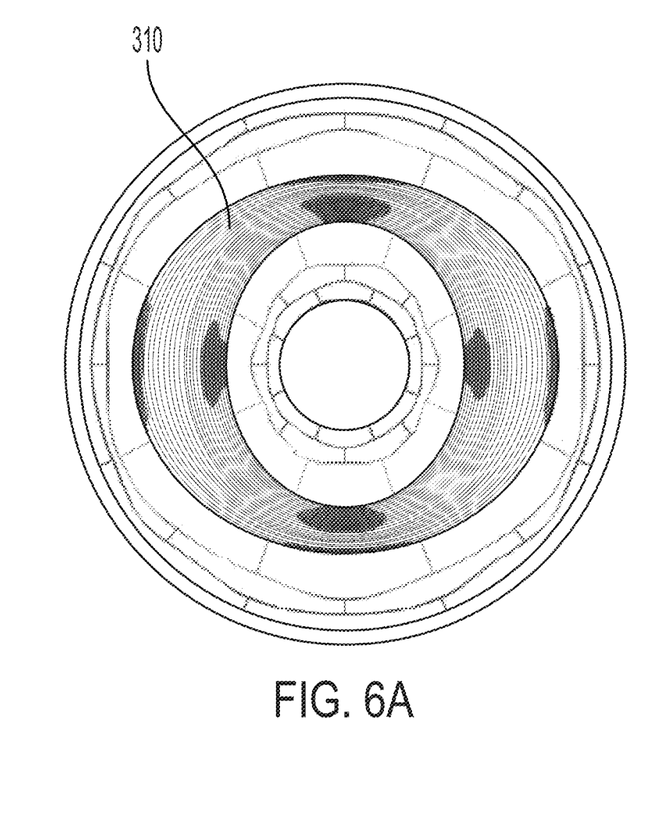
FIGS. 6A and 6B illustrate degenerate eigenmodes of the composite mesh ring vibrating structure of FIG. 3A in an extensional mode according to a non-limiting embodiment.
Figure 6B:
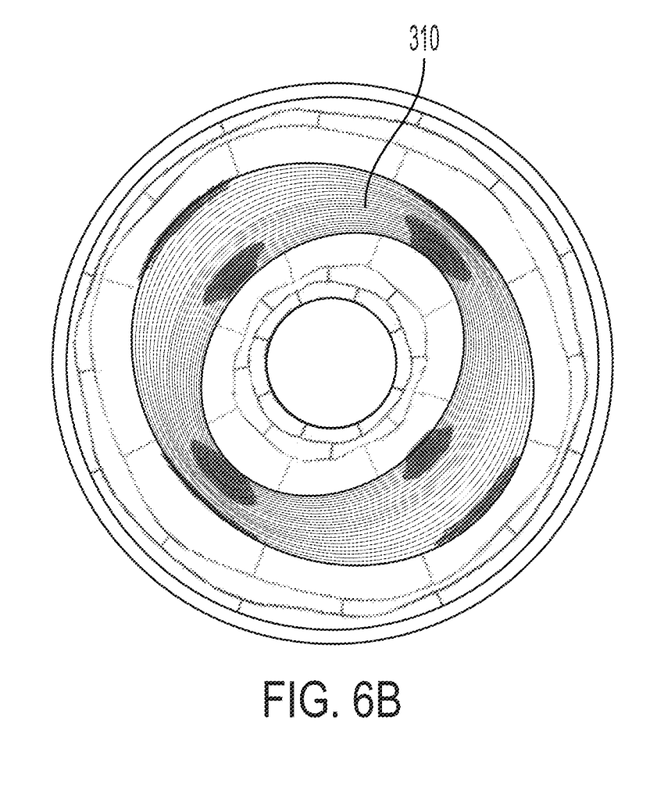

It will be appreciated that while FIGS. 3A and 3B illustrate a gyroscope design with extensional mode driven at 125 kHz, gyroscopes conforming to aspects of the present application may be driven at different frequencies (for example, 85 kHz or other frequency). FIGS. 6A and 6B illustrate composite mesh ring 310 vibrating in extensional mode in a Finite Element Analysis (FEA) simulation run.

Simulation and Results

Figure 7A:
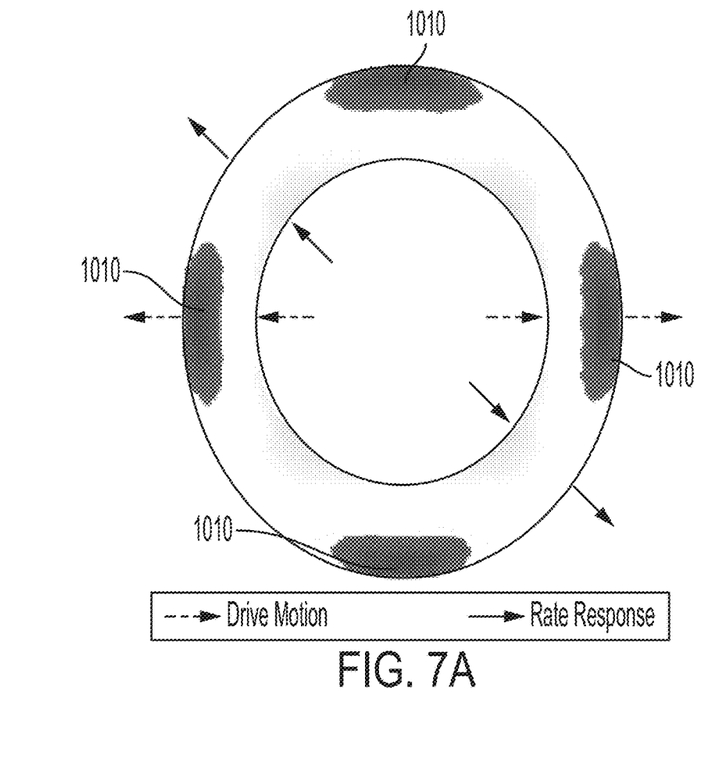
FIG. 7A illustrates modal displacements and vibration energy for a wineglass mode according to a non-limiting embodiment.
Figure 7B:
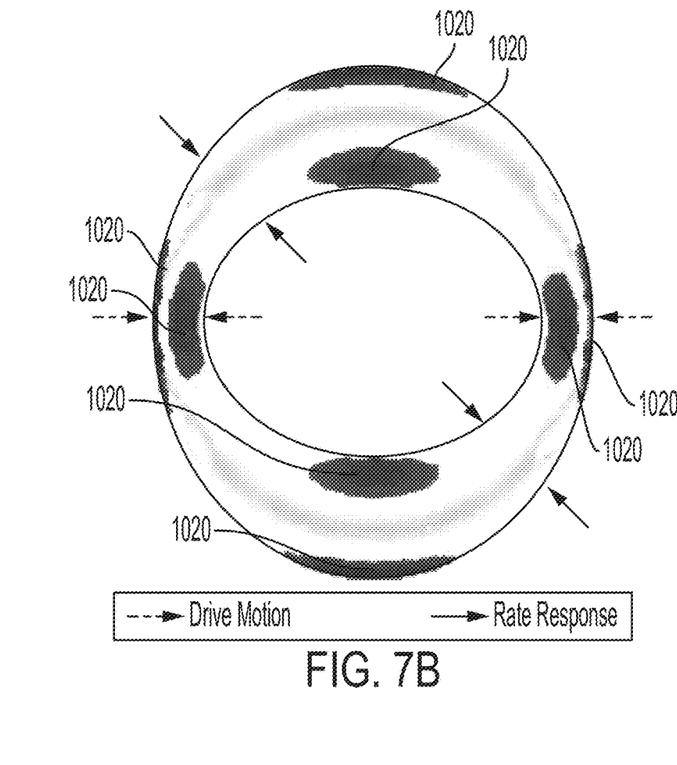
FIG. 7B illustrates modal displacements and vibration energy for an extensional mode according to a non-limiting embodiment.

It will be appreciated that while the MEMS ring gyroscope is described herein as operating in an extensional/pseudo-extensional mode, for purposes of comparing the wineglass mode versus extensional mode excitation, simulation was run for the MEMS ring gyroscope operating in wineglass mode and extensional mode. The mode of operation of the MEMS ring gyroscope was selected by changing the frequency of excitation and the configuration of the electrodes. Differential vs. common-mode combinations of inner and outer electrostatic electrodes select whether the wineglass or extensional mode is excited and sensed. FIGS. 7A and 7B show the results of a FEA simulation of the MEMS ring gyroscope (supporting structure omitted for clarity).

FIG. 7A illustrates modal displacement and vibration energy for wineglass mode. FIG. 7B illustrates modal displacement and vibration energy for extensional mode. The anchors and support structures are omitted for clarity in FIGS. 7A, 7B but included in simulation. As shown in Table 2 below, the angular gain and the modal mass of the extensional (n=2) mode was similar to that of wineglass (n=2) mode. As can be seen in FIG. 7A, the vibrational energy in the wineglass mode is concentrated in the outermost ring as shown by areas 1010, whereas the vibrational energy in the extensional mode (as can be seen in FIG. 7B) is concentrated substantially equally at the inner and outer sides of the ring as shown by areas 1020.

TABLE 2

| Wineglass vs. extensional mode | Wineglass | Extensional |
| --- | --- | --- |
| Modal mass (kg) | 2.35e-8 | 2.25e-8 |
| Angular gain k, (0 < k ≤ 1) | 0.76 | 0.78 |
| Quality factor (measured) | 160,000 | 109,000 |

The modal mass was extracted from eigenfrequency analysis by taking a ratio of the kinetic energy to the square of average velocity for each mode. The angular gain was calculated using the frequency domain analysis by harmonically driving the extensional mode near its resonant frequency and extracting the amplitude of the degenerate extensional mode in response to the applied rotation.

Figure 8:
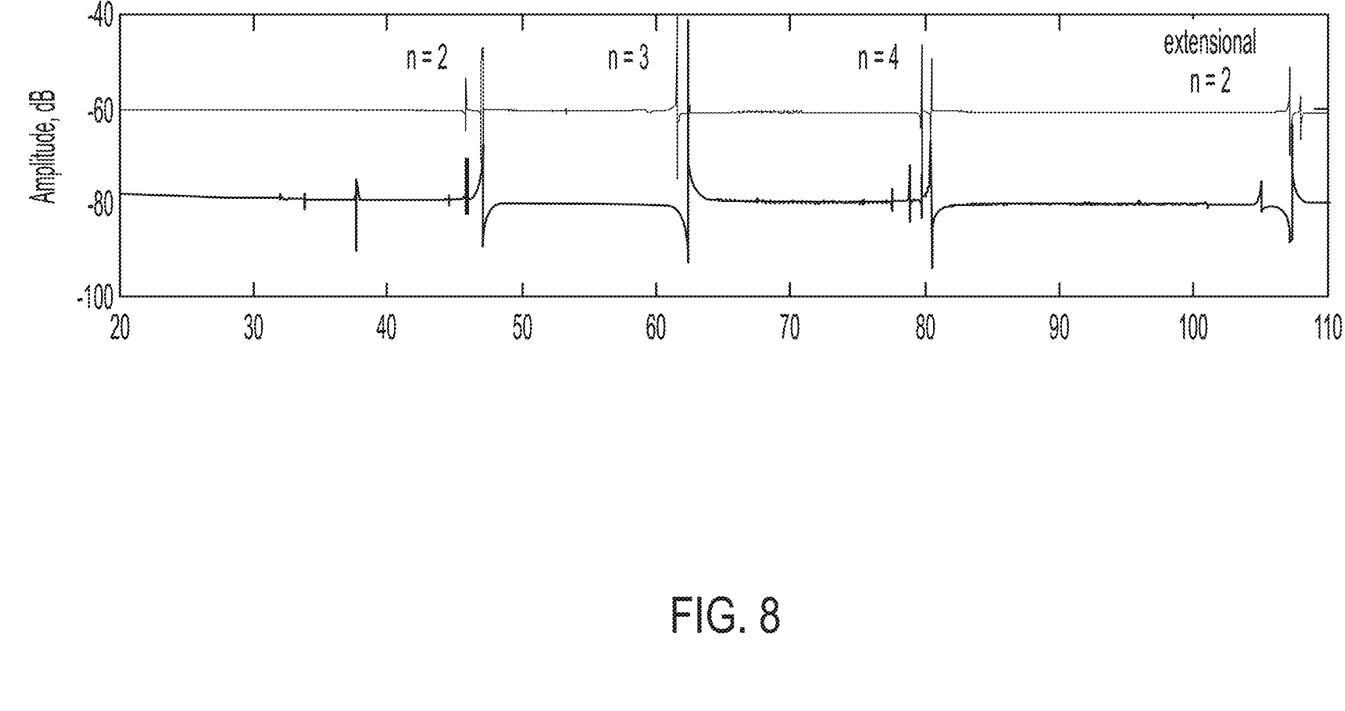
FIG. 8 illustrates a frequency sweep of vibratory modes according to a non-limiting embodiment.

A DC bias voltage of 20 V and AC voltage of 20 mV were used for initial experimental characterization. FIG. 8 illustrates a frequency sweep of the MEMS ring gyroscope showing wineglass (n=2, n=3, and n=4) modes followed by the extensional (n=2) mode.

Figure 9:
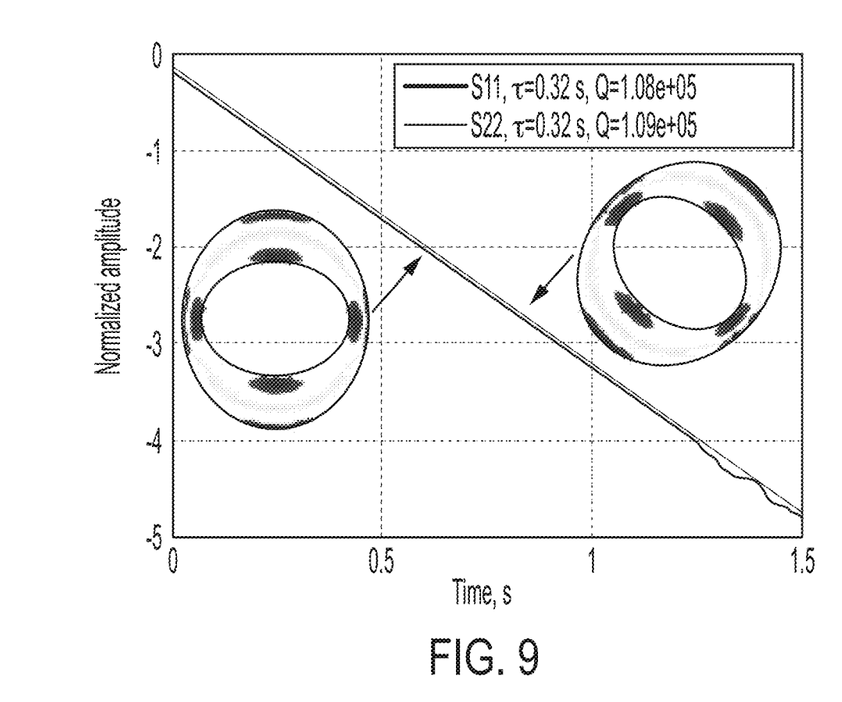
FIG. 9 illustrates a log linear plot of ring down showing Q factors for extensional modes according to a non-limiting embodiment.

FIG. 9 illustrates a log-linear plot of ring down showing Q-factors of 108,000 and 109,000 for the extensional degenerate (S11, S22) modes. S11 refers to a drive-mode for the pair of drive electrodes (e.g., pair 510 of FIG. 5A) and S22 refers to a sense-mode for the pair of sense electrodes (e.g., pair 520 of FIG. 5A). In a non-limiting embodiment, the on-axis frequency tuning electrodes (e.g., $T_0°$ and $T_{45}°$ as shown in FIG. 5B) may be used to match the frequencies of the degenerate modes and off-axis quadrature tuning electrodes (e.g., $Q^-$ and $Q^+$) may be used to remove quadrature.

Figure 10:
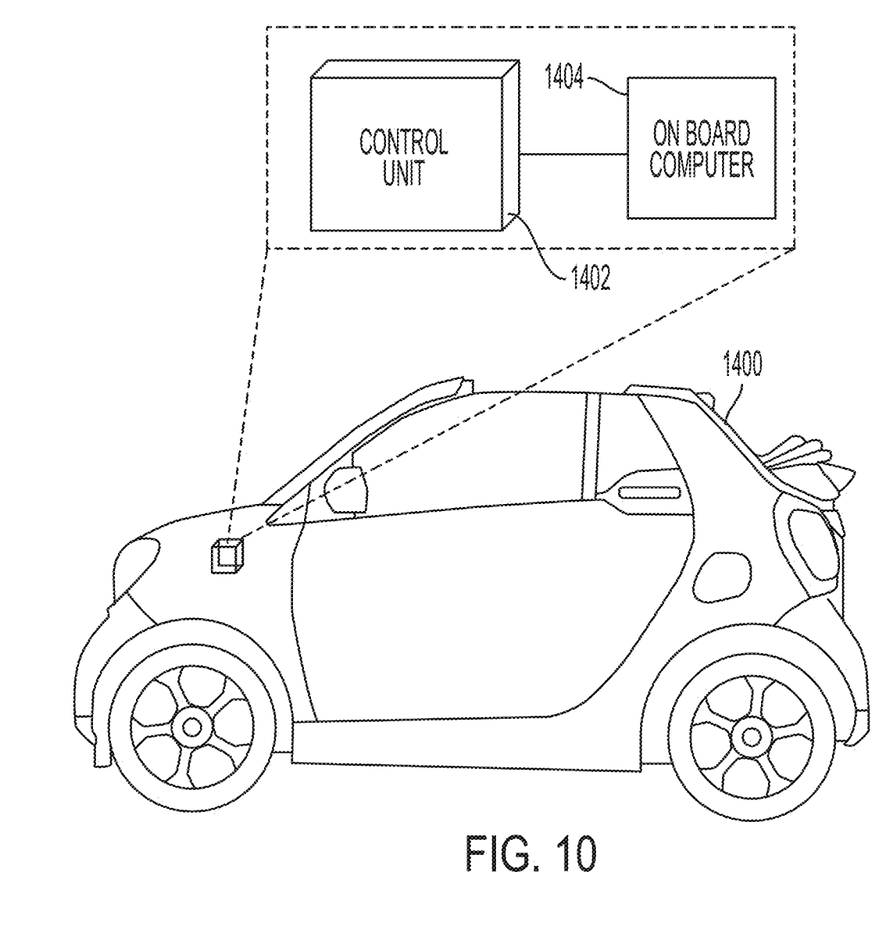
FIG. 10 illustrates an automobile which may include a MEMS ring gyroscope of the types described herein, according to a non-limiting embodiment.

FIG. 10 illustrates a non-limiting example in which at least one MEMS ring gyroscope of the types described herein is employed in a car. In the example of FIG. 10, an automobile 1400 includes a control unit 1402 coupled to an onboard computer 1404 of the car by a wired or wireless connection. Control unit 1402 may include at least one MEMS ring gyroscope of the type described herein. As a non-limiting example, the at least one MEMS ring gyroscope may detect rotation based on signals picked up by sense electrodes (e.g., sense electrodes 520-526). The control unit 1402 may receive power and control signals from the onboard computer 1404, and may supply output signals of the type described herein to the onboard computer 1404.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The terms "approximately," "substantially," and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A microelectromechanical systems (MEMS) gyroscope comprising:
    a vibrating ring structure comprising a first plurality of concentric rings and a plurality of flexural members;
    at least one pair of drive electrodes configured to electrostatically apply a voltage to the vibrating ring structure to excite the vibrating ring structure in an extensional mode, wherein:
        the at least one pair of drive electrodes comprises a first drive electrode and a second drive electrode positioned opposite each other on inner and outer sides of the first plurality of concentric rings and configured to operate with a same polarity signal;
    at least one pair of sense electrodes configured to electrostatically sense the extensional mode of the vibrating ring structure, wherein:
        the at least one pair of sense electrodes comprises a first sense electrode and a second sense electrode positioned opposite each other on inner and outer sides of the first plurality of concentric rings and configured to sense a same polarity signal;
    a first support structure configured to suspend the vibrating ring structure, the first support structure positioned on an inner side of the first drive electrode and the first sense electrode; and
    a second support structure configured to suspend the vibrating ring structure, the second support structure positioned on an outer side of the second drive electrode and the second sense electrode.

2. The MEMS gyroscope of claim 1, wherein the vibrating ring structure comprises a composite mesh ring including the first plurality of concentric rings, wherein the first plurality of concentric rings are connected to each other by the plurality of flexural members with a 22.5 degree offset in every other ring.

3. The MEMS gyroscope of claim 2, wherein the vibrating ring structure is configured so that a vibrational energy of the extensional mode is concentrated substantially equally at the inner and outer sides of the first plurality of concentric rings.

4. The MEMS gyroscope of claim 1, wherein the at least one pair of drive electrodes is configured to electrostatically excite an in-plane extensional mode of the vibrating ring structure.

5. The MEMS gyroscope of claim 4, wherein the at least one pair of sense electrodes is configured to electrostatically sense only the in-plane extensional mode of the vibrating ring structure.

6. The MEMS gyroscope of claim 1, wherein the vibrating ring structure comprises a composite mesh ring including the first plurality of concentric rings arranged with a first spacing and the first support structure comprises a second plurality of concentric rings arranged with a second spacing, wherein the second spacing is larger than the first spacing.

7. The MEMS gyroscope of claim 1, wherein the vibrating ring structure comprises a composite mesh ring including the first plurality of concentric rings, and wherein the first and second support structures are configured to allow movement of substantially equal amplitude of at least an innermost ring and an outermost ring of the composite mesh ring when excited in the extensional mode.

8. The MEMS gyroscope of claim 1, wherein the first support structure is configured to suspend the vibrating ring structure via an anchor.

9. An extensional mode gyroscope comprising:
a composite mesh ring comprising a first plurality of rings and a plurality of flexural members;
at least one pair of drive electrodes configured to electrostatically apply a voltage to the composite mesh ring to excite the composite mesh ring in an extensional mode, wherein:
the at least one pair of drive electrodes comprises a first drive electrode and a second drive electrode positioned opposite each other on inner and outer sides of the first plurality of rings and configured to operate with a same polarity signal;
at least one pair of sense electrodes configured to electrostatically sense the extensional mode of the composite mesh ring, wherein:
the at least one pair of sense electrodes comprises a first sense electrode and a second sense electrode positioned opposite each other on inner and outer sides of the first plurality of rings and configured to sense a same polarity signal; and
one or more support structures configured to allow movement of substantially equal amplitude of two or more rings of the first plurality of rings of the composite mesh ring when excited in the extensional mode, the one or more support structures comprising:
a first support structure positioned on an inner side of the first drive electrode and the first sense electrode, and
a second support structure positioned on an outer side of the second drive electrode and the second sense electrode.

10. The extensional mode gyroscope of claim 9, wherein the at least one pair of sense electrodes is configured to electrostatically sense only the extensional mode.

11. The extensional mode gyroscope of claim 9, wherein the first support structure is configured to suspend the composite mesh ring via a first anchor.

12. The extensional mode gyroscope of the claim 11, wherein the second support structure is configured to suspend the composite mesh ring via a second anchor.

13. The extensional mode gyroscope of claim 9, wherein the first plurality of rings are arranged with a first spacing, and each of the one or more support structures comprises a second plurality of rings arranged with a second spacing, wherein the second spacing is larger than the first spacing.

14. The extensional mode gyroscope of claim 9, wherein a ring width of each of the first plurality of rings of the composite mesh ring is 5 µm.

15. The extensional mode gyroscope of claim 9, wherein a number of the first plurality of rings of the composite mesh ring is 40.

16. The extensional mode gyroscope of claim 12, wherein the first anchor is positioned on an inner side of the first support structure and the second anchor is positioned on an outer side of the second support structure.

17. A method of operating a microelectromechanical systems (MEMS) gyroscope having a composite mesh ring comprising a closed contour inner edge and a closed contour outer edge, at least one pair of drive electrodes, at least one pair of sense electrodes, a first support structure positioned on an inner side of the composite mesh ring and a second support structure positioned on an outer side of the composite mesh ring, the method comprising:
electrostatically exciting, via the at least one pair of drive electrodes, the composite mesh ring in an in-plane extensional mode, wherein the closed contour inner edge and the closed contour outer edge of the composite mesh ring move with substantially equal amplitude upon excitation of the composite mesh ring in the in-plane extensional mode; and
electrostatically sensing, via the at least one pair of sense electrodes, one or more signals generated by the composite mesh ring in response to the composite mesh ring being excited in the in-plane extensional mode,
wherein exciting the composite mesh ring in the in-plane extensional mode comprises exciting the composite mesh ring in an in-plane extensional mode that has an angular gain greater than or equal to 0.78.

18. The method of claim 17, wherein exciting the composite mesh ring in the in-plane extensional mode comprises:
exciting the composite mesh ring in an in-plane extensional mode that is within 100 kHz.

19. The method of claim 17, wherein a width of the composite mesh ring changes across a circumference of the composite mesh ring in response to the composite mesh ring being excited in the in-plane extensional mode.

20. The method of claim 17, wherein the in-plane extensional mode appears as two superimposed wineglass modes driven in anti-phase relative to each other.

* * * * *